(12) United States Patent
Veda et al.

(10) Patent No.: US 11,355,930 B2
(45) Date of Patent: Jun. 7, 2022

(54) PHASE IDENTIFICATION USING STATISTICAL ANALYSIS

(71) Applicant: Alliance for Sustainable Energy, LLC, Golden, CO (US)

(72) Inventors: Santosh Sambamoorthy Veda, Littleton, CO (US); Surya Chandan Dhulipala, Gainesville, FL (US); Murali Mohan Baggu Data Venkata Satya, Golden, CO (US); Harsha Vardhana Padullaparti, Lakewood, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 16/905,490

(22) Filed: Jun. 18, 2020

(65) Prior Publication Data
US 2020/0403405 A1 Dec. 24, 2020

Related U.S. Application Data

(60) Provisional application No. 62/862,877, filed on Jun. 18, 2019.

(51) Int. Cl.
*H02J 3/00* (2006.01)
*H02J 3/28* (2006.01)
*G01R 21/133* (2006.01)
*H02J 3/16* (2006.01)

(52) U.S. Cl.
CPC ............ *H02J 3/004* (2020.01); *G01R 21/133* (2013.01); *H02J 3/16* (2013.01); *H02J 3/28* (2013.01); *H02J 2203/20* (2020.01)

(58) Field of Classification Search
CPC ...... H02J 3/004; H02J 3/28; H02J 3/16; H02J 2203/20; H02J 3/00; H02J 2203/10; H02J 13/00002; G01R 21/133; Y02E 40/30
See application file for complete search history.

(56) References Cited

U.S. PATENT DOCUMENTS

| 5,510,700 | A | 4/1996 | Pomatto |
| 7,808,228 | B1 * | 10/2010 | Bierer ................ G01R 29/18 |
| | | | 324/76.77 |

(Continued)

OTHER PUBLICATIONS

Arya et al., "Phase identification in smart grids," presented at the IEEE International Conference on Smart Grid Communications (SmartGridComm), Brussels, 2011, pp. 25-30.

(Continued)

*Primary Examiner* — Ziaul Karim
(74) *Attorney, Agent, or Firm* — Robert G. Pittelkow

(57) ABSTRACT

A device includes at least one processor configured to determine, based on (i) a first plurality of time-varying electrical measurements corresponding to a feeder head of a power distribution network having a plurality of phases and (ii) a second plurality of time-varying electrical measurements corresponding to a node in the power distribution network, and using statistical analysis, a predicted phase, from the plurality of phases, that corresponds to the node. The processor may be configured to use ranked correlation coefficients (such as the Kendall rank correlation coefficient) to determine the predicted phase and may use principle component analysis. The processor is also configured to cause at least one device of the power distribution network to modify operation based at least on part on the predicted phase.

12 Claims, 2 Drawing Sheets

(56) References Cited

U.S. PATENT DOCUMENTS

| | | | |
|---|---|---|---|
| 2011/0282508 A1* | 11/2011 | Goutard | H04L 63/20 700/293 |
| 2014/0028463 A1* | 1/2014 | Chamarti | G01D 4/002 340/870.02 |
| 2014/0207301 A1* | 7/2014 | San Andres | G06F 1/30 700/295 |
| 2014/0379156 A1* | 12/2014 | Kamel | G06Q 10/06 700/291 |
| 2015/0379429 A1* | 12/2015 | Lee | G06N 20/00 706/11 |
| 2016/0198245 A1* | 7/2016 | Rhoads | G01R 19/2513 340/870.02 |
| 2017/0060161 A1* | 3/2017 | Tyler | G06Q 50/06 |
| 2017/0278200 A1* | 9/2017 | Yamazaki | H02J 13/0079 |
| 2018/0103302 A1* | 4/2018 | Bell | G01R 21/133 |

OTHER PUBLICATIONS

Dilek, "Integrated Design of Electrical Distribution Systems: Phase Balancing and Phase Prediction Case Studies," Ph.D. Dissertation, Virginia Polytechnic Institute and State University, 2001, pp. 1-150.

Satya et al., "Identifying Topology of Power Distribution Networks Based on Smart Meter Data," arXiv: 1609.02678 [cs.SY], Sep. 2016, pp. 1-8.

Padullaparti et al., "Considerations for AMI-Based Operations for Distribution Feeders" 2019 IEEE Power & Energy Society General Meeting (PESGM) Aug. 4-8, 2019 Atlanta, GA, pp. 1-5.

Pezeshki et al., "Correlation based method for phase identification in a three phase LV distribution network", Innovative Smart Grid Technologies Europe (ISGT Europe), 2012 3rd IEEE Pes International Conference, Oct. 2012, Berlin, pp. 1-7.

Short, "Advanced Metering for Phase Identification, Transformer Identification, and Secondary Modeling", IEEE Transactions on Smart Grid, Jun. 2013, vol. 4, No. 2, pp. 651-658.

Wang et al., "Phase Identification in Electric Power Distribution Systems by Clustering of Smart Meter Data", 2016 15th IEEE International Conference on Machine Learning and Applications, 2016, vol. 1, pp. 259-265.

Wang et al., "Advanced Metering Infrastructure Data Driven Phase Identification in Smart Grid", Green 2017: The Second International Conference on Green Communications, Computing and Technologies, Sep. 2017, p. 16-23.

\* cited by examiner

PHASE IDENTIFICATION USING STATISTICAL ANALYSIS

CROSS REFERENCE TO RELATED APPLICATIONS

This application claims the benefit of U.S. Provisional Application No. 62/862,877, titled "DISTRIBUTION NETWORK PHASE IDENTIFICATION" and filed Jun. 18, 2019, the entire content of which is incorporated herein by reference.

CONTRACTUAL ORIGIN

This invention was made under a CRADA (CRADA No. CRD-17-712) between San Diego Gas & Electric and the National Renewable Energy Laboratory operated for the United States Department of Energy. The Government has certain rights in this invention.

The United States Government has rights in this invention under Contract No. DE-AC36-08GO28308 between the United States Department of Energy and Alliance for Sustainable Energy, LLC, the Manager and Operator of the National Renewable Energy Laboratory.

BACKGROUND

Advanced metering infrastructure (AMI) is a major milestone toward the vision of achieving a modernized electric grid. Substantial investments are being made by utilities to improve metering and the communications infrastructure. Outage management, power quality issues, integration of demand response and distributed energy resources (DER) are some of the benefits of AMI.

An important application for AMI deployment is enabling the utility to create and/or maintain good models of the distribution network. For example, the operation, monitoring, and control of distribution networks with increased DER penetration requires accurate feeder models down to the point of interconnection. There is also an increasing need to model the secondary low-voltage distribution circuits because the DERs are located at this level.

SUMMARY

In one example, a device includes at least one processor configured to determine, based on (i) a first plurality of time-varying electrical measurements corresponding to a feeder head of a power distribution network having a plurality of phases and (ii) a second plurality of time-varying electrical measurements corresponding to a node in the power distribution network, and using statistical analysis, a predicted phase, from the plurality of phases, that corresponds to the node. The at least one processor may be further configured to cause at least one device of the power distribution network to modify operation based at least on part on the predicted phase.

In another example, a method includes determining, by a computing device comprising at least one processor, based on (i) a first plurality of time-varying electrical measurements corresponding to a feeder head of a power distribution network having a plurality of phases and (ii) a second plurality of time-varying electrical measurements corresponding to a node in the power distribution network, and using statistical analysis, a predicted phase, from the plurality of phases, that corresponds to the node. The method may also include causing at least one device of the power distribution network to modify operation based at least on part on the predicted phase.

The details of one or more examples are set forth in the accompanying drawings and the description below. Other features, objects, and advantages will be apparent from the description and drawings, and from the claims.

DETAILED DESCRIPTION

Figure 1:
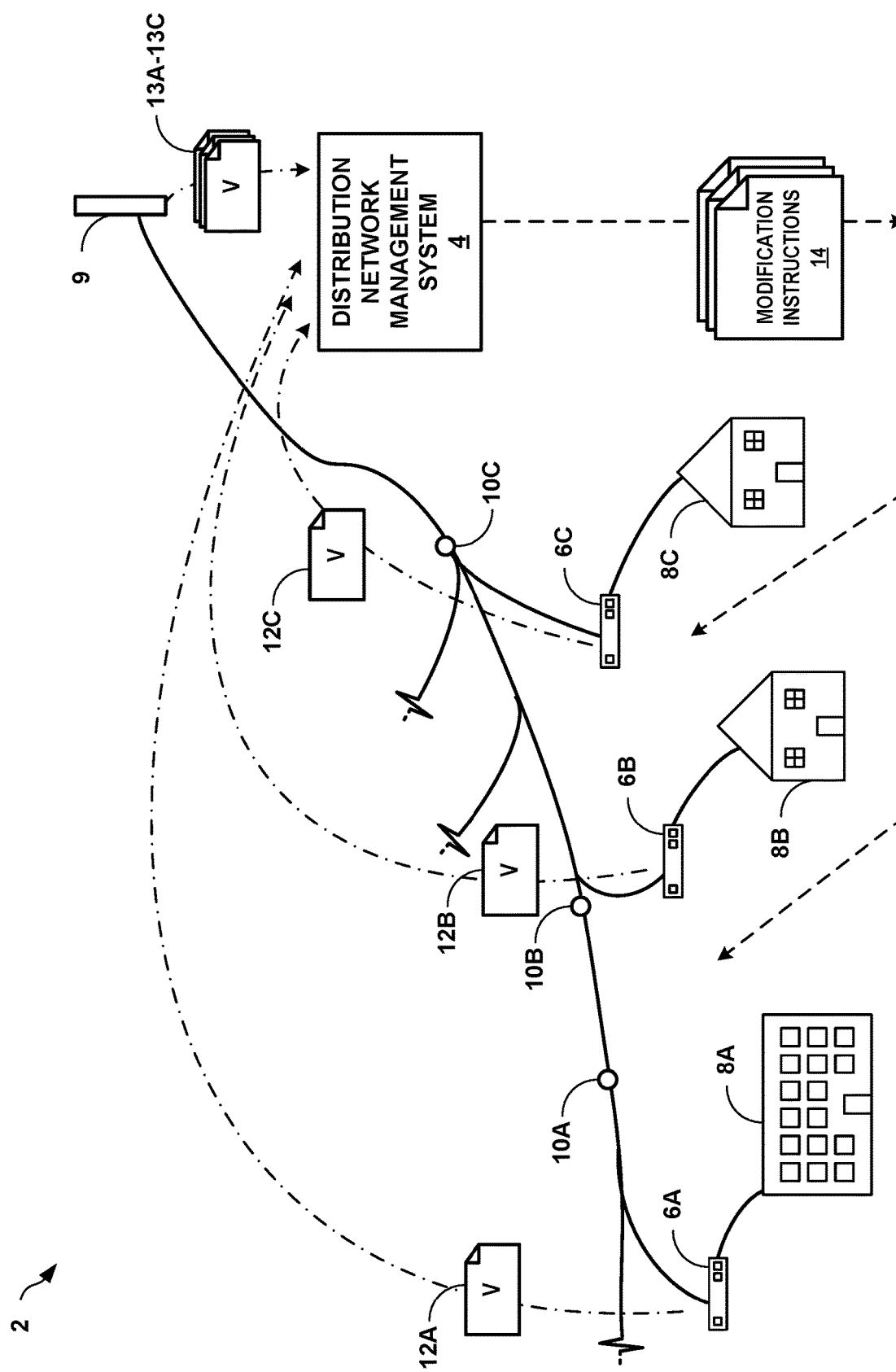
FIG. 1 is a conceptual diagram illustrating an example distribution network management system configured to determine predicted phases in a power distribution network using statistical analysis, in accordance with one or more aspects of the present disclosure.

The techniques of the present disclosure provide systems, devices, and methods for identifying phases in a power distribution network using statistical analysis. For example, a distribution network management system or other device may receive or otherwise have access to advanced metering infrastructure (AMI) data, such as time-varying (e.g., periodic) voltage measurements or other measurements, corresponding to nodes in a power distribution network. The distribution network management system may also receive or otherwise have access to time-varying measurements from multiple phases in the power distribution network at a feeder head or substation of the power distribution network. By performing statistical analysis (e.g., ranked correlation, and/or others) on the values corresponding to the feeder head and the values corresponding to the nodes, the distribution network management system may accurately determine the predicted phase connectivity for such nodes. The distribution network management system may then utilize such predicted phases to more efficiently manage the power distribution network, such as switching loads among the phases to balance distribution, more quickly address faults or outages by switching loads to different phases, making accurate volt/volt-ampere reactive (VAR) control decisions, or taking other actions. The techniques described herein allow for reliable phase identification in power distribution networks, including those with high PV or other DER penetration levels. That is, the techniques described herein work both for distribution networks without DER penetrations as well as those that include various levels of DER penetration.

Many distribution network analysis, monitoring, and control applications—including load balancing, state estimation, volt/VAR control, distribution automation, and network reconfiguration—depend on accurate phase connectivity information. Phase connectivity databases maintained by utilities are often inaccurate due to a significant amount of missing data, restoration activities, and/or network reconfiguration. Related-art phase identification techniques are designed for passive distribution networks, such as those without distributed energy resources (DERs) like Photovoltaics (PV). Because such techniques do not consider the impact of power injections from the DERs, they may not provide accurate phase identification results in active distribution networks.

In contrast, by using statistical analysis on time-varying measurements, the techniques described herein allow for reliable phase identification in power distribution networks with high PV or other DER penetration levels. That is, the techniques described herein work both for distribution networks without DER penetrations as well as those that include various levels of DER penetration (active and passive distribution networks). Accurate determination of predicted phases enables more efficient and accurate management of power distribution networks, thereby reducing energy loss and/or operation costs.

FIG. 1 is a conceptual diagram illustrating an example distribution network management system (e.g., distribution network management system 4) configured to determine predicted phases in a power distribution network (e.g., network 2) using statistical analysis, in accordance with one or more aspects of the present disclosure. In the example of FIG. 1, network 2 includes distribution network management system 4 ("DNM system 4"), metering devices 6A-6C (collectively "metering devices 6") and nodes 8A-8C (collectively "nodes 8"). Network 2 also includes connection point 9 and network infrastructure devices 10A-10C (collectively "network infrastructure devices 10"). As shown in the example of FIG. 1, metering devices 6, nodes 8, connection point 9, and network infrastructure devices 10 are all connected via a network of power lines and, with those power lines, may represent a "power system".

Network 2, as shown in the example of FIG. 1, represents a simplified power distribution network. In other examples, the power distribution network may include any number of network metering devices 6, nodes 8, and/or network infrastructure devices 10. Thus, while shown in FIG. 1 as having three metering devices, three nodes, and three network infrastructure devices, the power distribution network may, in other examples, include more or fewer metering devices, nodes, and/or network infrastructure devices in other examples. For instance, the techniques of the present disclosure may be used with a micro-grid, a subset of a power distribution network, an entire power distribution network, a community power grid (e.g., in which a collection of residents implement a local power network), a campus power grid (e.g., in which a company or educational institution implements its own power network), or any other collection of connected power generation and consumption devices.

In the example of FIG. 1, DNM system 4 is a system having at least one processor that is configured to manage the power system shown in FIG. 1 to provide power to consumers (e.g., nodes 8). In such example, DNM system 4 may manage the distribution of power from DERs within the power system (not shown), as well as the receipt and distribution of power from the larger power system (e.g., via connection point 9), while avoiding overloading and ensuring that consumers' power needs are met. In some examples, DNM system 4 may represent a system owned and operated by a utility company. In other examples, DNM system 4 may be owned and/or operated by another entity. For instance, DNM system 4 may represent an access point of a power network of a business park or corporate campus. As another example, DNM system 4 may manage a micro-grid, such as may be employed on a military base, mobile hospital, or other small area in which electrical power may be desirable. In other words, DNM system 4 may represent any system configured to manage power distribution via a power network.

While shown as a single box in the example of FIG. 1, DNM system 4 may, in some examples, be made up of multiple devices. That is, in various examples, DNM system 4 may be a standalone unit or device, may be a collection of interconnected devices (each having at least one processor), may be a cloud computing environment (e.g., devices/processors operating together via the Internet or other wide area network), or any other collection of devices capable of performing the techniques described herein. Additionally, in some examples DNM system 4 may be integrated with connection point 9 and/or other systems. That is, while shown as discrete in the example of FIG. 1, some components may, in some examples, be unified and/or interconnected.

In the example of FIG. 1, metering devices 6 are devices configured to measure electrical quantities at a location of the power system and output the measurements. For instance, metering devices 6 may represent advanced metering infrastructure (AMI) devices, also known as "smart meters". Metering devices 6 may be configured to measure various electrical quantities at their respective locations, such as voltage values, active power and reactive power consumption values, energy values, current values, or frequency values. In the example of FIG. 1, each of metering devices 6 is associated with a respective one of nodes 8.

Nodes 8, in the example of FIG. 1, are consumers of electrical power. For example, node 8A may represent an industrial consumer, node 8B may represent a commercial consumer, and node 8C may represent a residential consumer. In the example of FIG. 1, the consumption of power by nodes 8 is connected to network 2 through a respective one of metering devices 6. Thus, metering devices 6 may measure electrical quantities of network 2 that represent the status of the network at nodes 8. While depicted in FIG. 1 as representing a single node, consumers may, in some examples, represent multiple nodes on a power distribution network. For example, an industrial consumer may utilize more than one phase of the power distribution network due to higher power demands. Thus, such consumer may represent two or even three nodes. For brevity, only single nodes are shown in the example of FIG. 1.

In the example of FIG. 1, connection point 9 represents a point at which the power distribution network is connected to a larger system. For example, connection point 9 may represent the connection of network 2 to a power transmission network. As another example, network 2 may represent a subset of a power distribution network and connection point 9 may connect network 2 to the broader power distribution network. In other words, connection point 9 is the point at which the smaller power system shown in FIG. 1 connects to the rest of the power system. Examples of connection point 9 include a power substation, a point of connection of a microgrid to the rest of the grid, a single metering point for a community-level aggregation, or other suitable facility and/or device.

In the example of FIG. 1, network infrastructure devices 10 are devices configurable to manage the flow of power within network 2. In various examples, network infrastructure devices 10 may be remotely controlled and/or may be controlled manually via physical manipulation. Examples of network infrastructure devices 10 include inverter-interfaced residential PV and energy storage systems, volt/VAR control devices, switches, reclosers, sectionalizers, voltage regulators, and other systems or devices capable of modifying operation of, and/or the flow of power within, a power distribution network.

Network 2 represents a three-phase power system in the example of FIG. 1. That is, while shown in the example of FIG. 1 as single lines connecting connection point 9 to metering devices 6, nodes 8, and network infrastructure devices 10, network 2 actually includes three different phases of power, which may be distributed in various ways to different devices within network 2. For instance, each of nodes 8 may receive a single phase from network 2 via metering devices 8. Which phases are received by which nodes may be controlled using network infrastructure devices 10, among other means.

In the example of FIG. 1, each of metering devices 6 may measure the voltage of network 2 at the respective one of nodes 8 (each a single phase), thereby generating measurements 12A-12C (collectively "measurements 12"). In some examples, measurements 12 may include additional or alternative measurements, such as active power and reactive power consumption measurements, current measurements, frequency measurements, energy measurements, and/or measurements of other electrical quantities at respective nodes 8. Each value in measurements 12 may also include a timestamp at which such value was measured. Metering devices 6 may output measurements 12 via one or more wired or wireless networks (not shown) such as the Internet or any other data communications means.

Connection point 9 may measure the voltage of each phase at the feeder head, thereby generating measurements 13A-13C (collectively "measurements 13"). That is, measurements 13A may be measurements of a first phase at the feeder head, measurements 13B may be measurements of a second phase at the feeder head, and measurements 13C may be measurements of a third phase at the feeder head. In some examples, measurements 13 may include additional or alternative measurements, such as active power and reactive power consumption measurements, current measurements, frequency measurements, energy measurements, and/or measurements of other electrical quantities of each phase at the feeder head. Each value in measurements 13 may also include a timestamp at which such value was measured. Connection point 9 may output measurements 13 via one or more wired or wireless networks (not shown).

Metering devices 6 and connection point 9 may generate and output measurements 12 and 13 on a periodic basis. For example, measurements 12 and 13 may be generated every 5 seconds, every 30 seconds, every minute, every 15 minutes, every hour, or at another frequency. In this way, metering devices 6 and connection point 9 may provide time-varying signals that show how electrical quantities vary over time.

In accordance with the techniques of the present disclosure, a device including at least one processor may be configured to receive or otherwise access time-varying electrical measurements corresponding to a node and corresponding to phases at a feeder head. For example, DNM system 4 may receive or otherwise have access to periodic versions of measurements 12 and measurements 13, which provide both voltage values and corresponding times of measurement corresponding to each of nodes 8 and to the three phases at connection point 9.

The processor may be configured to determine, based on (i) a first plurality of time-varying electrical measurements corresponding to a feeder head of a power distribution network having a plurality of phases and (ii) a second plurality of time-varying electrical measurements corresponding to a node in the power distribution network, and using statistical analysis, a predicted phase, from the plurality of phases, that corresponds to the node. For instance, DNM system 4 may utilize statistical analysis to analyze measurement 12A and measurements 13 and determine a predicted phase corresponding to node 8A.

As one concrete example, DNM system 4 may determine, for each of measurements 12, a ranked correlation coefficient (e.g., a Kendall rank correlation coefficient) between such measurements and each of measurements 13. Specifically, DNM system 4 may determine a first ranked correlation coefficient between measurements 12A and measurements 13A corresponding to the first phase, a second ranked correlation coefficient between measurements 12A and measurements 13B corresponding to the second phase, and a third ranked correlation coefficient between measurements 12A and measurements 13C corresponding to the third phase. DNM system 4 may similarly determine three ranked correlation coefficients using measurements 12B and another three using measurements 12C.

To determine each coefficient, DNM system 4 may compare pairs of time-correlated values or "observations" (each observation including one value from the node being considered and one value from the feeder head phase being considered) to other observations to determine whether the set of two observations are discordant or concordant, subtract the number of discordant pairs of observations from the number of concordant pairs of observations, and divide the result by the total number of observations. For instance, DNM system 4 may create observations where one value is from measurements 12A and one value is from measurements 13A and determine whether these observations are discordant or concordant with other observations formed from one value from measurements 12A and one value from measurements 13A.

DNM system 4 may select, as a predicted phase for each set of measurements 12 (and thus each of metering devices 6 and nodes 8), that phase which produced the best ranked correlation coefficient. For instance, since the Kendall ranked correlation coefficient produces values between −1 and 1, with −1 representing perfect inverse correlation, zero representing no correlation, and 1 representing perfect correlation, DNM system 4 may select, as a predicted phase for a node, the phase of which one of measurements 13A, 13B, or 13C produced the largest (i.e., closest to 1) coefficient. In some examples, inverse correlation may also be used as an indicator of correlation. That is, in some examples an absolute value of the correlation coefficients may be generated and used to determine which one of measurements 13A, 13B, or 13C produced the best correlation coefficient.

The time information contained in measurements 12 and measurements 13 may be used by DNM system 4 to ensure proper statistical analysis when metering devices 6 and/or connection point 9 generates and outputs measurements at different time intervals. That is, the frequency at which values are measured by or received from one or more devices may be different than that at which values are measured by or received from other devices. Thus, DNM system 4 may utilize the time information to ensure that measurements from the same or substantially similar time are compared. In some examples, this may include discarding values, computing average values, computing weighted average values, and/or performing other operations.

In some examples, DNM system 4 may utilize Principal Component Analysis (PCA) to reduce the dimensionality of the measurement dataset while retaining the covariance. PCA can be applied if the measurement dataset is very large, like in the case of large distribution feeders with numerous AMI meters measuring the electrical quantities for a long period of time. Then the rank correlation can be applied on the lower-dimensional dataset obtained after applying PCA to determine phase connectivity.

In accordance with the techniques described herein, the processor may be further configured to cause at least one device of the power distribution network to modify operation based at least in part on the predicted phase. For example, DNM system 4 may output modification instructions 14, thereby causing one or more of network infrastructure devices 12 to modify operation based on the predicted phase for nodes 8A, 8B, and/or 8C. Examples of device modification include: connecting node 8A (or 8B or 8C or others) to a different phase for unbalance mitigation, switching a node to a healthy phase during faults affecting the phase the node was previously on, outputting instructions to smart inverters that are connected to the grid and controlling residential PV systems, energy storage systems, or other DERs, instructing the inverters to modify a real and/or reactive output power (e.g., a changed power setpoint) for improved voltage regulation; outputting instructions to volt/VAR control devices for secondary distribution networks to cause such devices to modify real or reactive power values; changing loads (or causing loads to change) from one phase to another in order to improve load balancing among the phases; and using the predicted phase to obtain accurate power injection measurements, which can be used in turn for distribution network control. In yet additional examples, DNM system 4 may cause network infrastructure devices 12 and/or other devices of the power distribution network to modify operation based on the predicted phases by outputting an indication of the predicted phases for use by other devices.

While described in the example of FIG. 1 as having a single phase, energy consumers (or "buses") may, in various examples, be connected to the distribution network via more than one phase. For instance, node 8A may connect a bus that also has a second node and possibly a third node (not shown in FIG. 1). In such examples, the techniques described herein may be used to determine a predicted phase for each node of the bus. In some examples, measurements for each node in a bus may be received by DNM system 4. Consequently, when using ranked correlation coefficients to determined predicted phases, DNM system 4 may determine three, six, or even nine coefficients for each bus.

In some examples, DNM system 4 may determine predicted phases and/or cause devices to modify operation in a periodic fashion. For example, DNM system 4 may perform phase determination for each phase at each bus every day, every week, every hour, or at some other interval. That is, energy consumer AMI data is typically stored in a computer system (e.g., DNM system 4) at a central location such as a substation. The techniques described herein can run in this computer at a preset time every day to identify the phase connectivity of the consumers equipped with AMI meters.

As described herein, a bus in a distribution network may have one, two, or all the three phases. Distribution networks typically consist of a primary system, operating at a medium-voltage level, and a secondary-system operating at a low-voltage level. Most of the consumers are connected to the secondary system. The techniques of the present disclosure perform statistical analysis of AMI data collected from the consumers having AMI meters installed at their premises to determine their phase connectivity. In the present disclosure, various methods of statistical analysis can be used to determine predicted phases. In one example, Kendall rank correlation coefficients or other ordinal associations are computed at each node of all the buses along the feeder using electrical quantity measurement data at that node and the data recorded at the three nodes (i.e., three phases) at the substation (feeder head). The feeder head phase voltage data that has the highest correlation coefficient is determined as the predicted phase of the selected node on the feeder. In some examples, the 5-minute average per-phase electrical quantity data from the AMI meters recorded for one-day period is used for the analysis.

The predicted phases may be used (e.g., by a distribution system operator) to improve management of the distribution system. For example, this information may be used in volt/var control, state estimation, and/or distribution automation. The predicted phases may result in more accurate and/or quick determination of network issues, more efficient management of load distribution, or to improve other areas of management of the distribution system.

Figure 2:
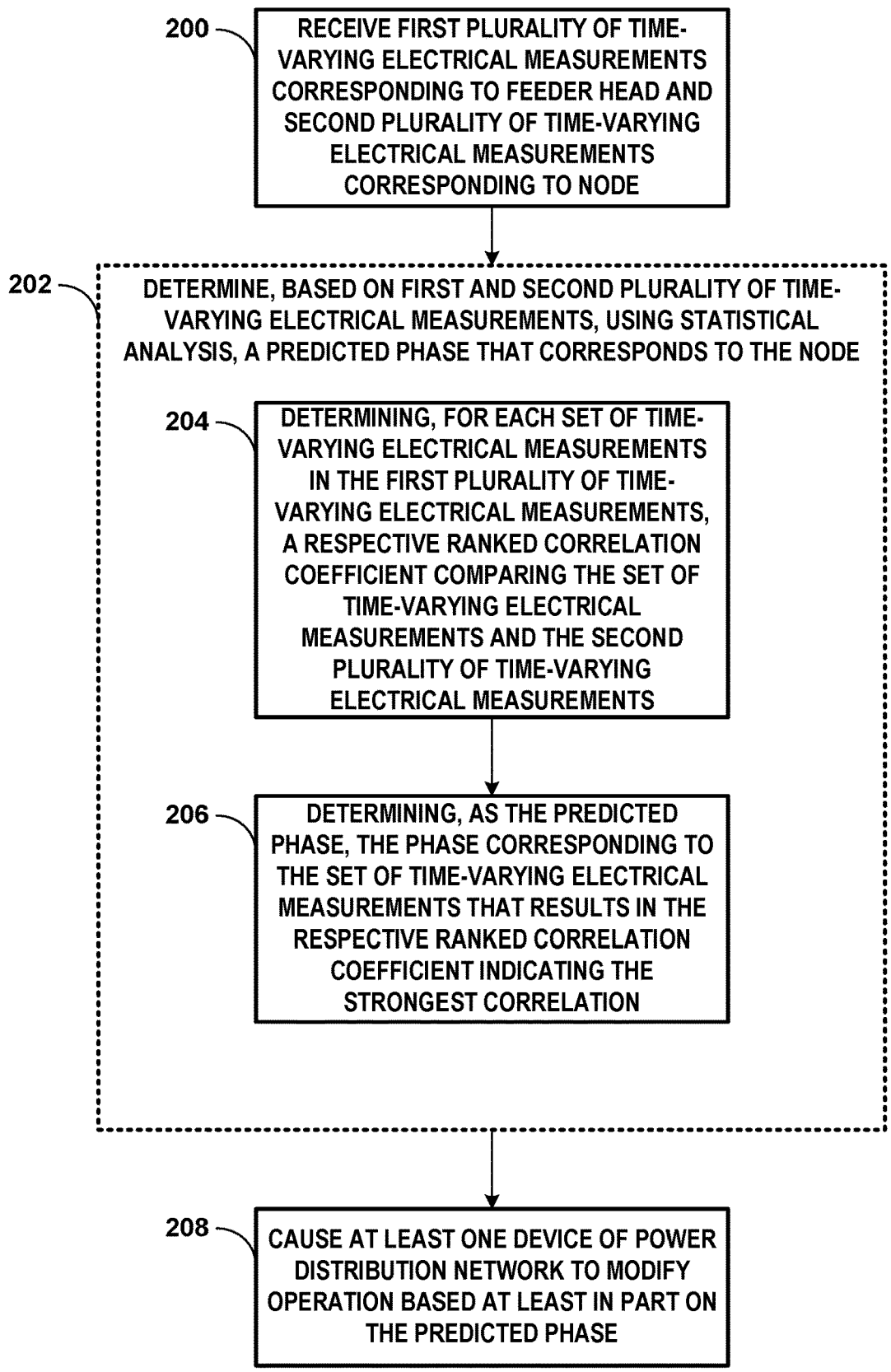
FIG. 2 is a flow diagram illustrating example operations for performing phase identification using statistical analysis, in accordance with one or more aspects of the present disclosure.

FIG. 2 is a flow diagram illustrating example operations for performing phase identification using statistical analysis, in accordance with one or more aspects of the present disclosure. FIG. 2 represents only one example process for performing phase identification using statistical analysis as described herein, and various other or additional operations may be used in other examples. Specifically, FIG. 2 represents operations to perform phase identification using ranked correlation coefficients, such as the Kendall rank correlation coefficient. The example operations of FIG. 2 are described below within the context of FIG. 1.

In the example of FIG. 2, a computing device comprising at least one processor may be configured to receive or otherwise access a first plurality of time-varying electrical measurements and a second plurality of time-varying electrical measurements (200). The first plurality of time-varying electrical measurements may correspond to a feeder head of a power distribution network having a plurality of phases. The second plurality of time-varying electrical measurements may correspond to a node in the power distribution network. For example, DNM system 4 may receive measurements 13 from connection point 9 and one or more of measurements 12 from metering devices 6. As described above with respect to FIG. 1, measurements 12 and measurements 13 may be measurements of voltage, frequency, or other electrical quantities at the respective locations. Measurements 13 may include multiple sets of measurements, with each set corresponding to a separate phase of the power distribution network. Each of measurements 12 may represent a single phase corresponding to a single node of a consumer or bus.

In the example of FIG. 2, the computing device may be configured to determine, based on the first and second plurality of time-varying electrical measurements, using statistical analysis, a predicted phase, from the plurality of phases, that corresponds to the node (202). In the specific example of FIG. 2, DNM system 4 may use ranked correlation coefficients such as the Kendall rank correlation coefficient to determine the predicted phase. The first plurality of time-varying electrical measurements may include a respective set of time-varying electrical measurements for at least two phases in the plurality of phases existing in the power distribution network. The second plurality of time-varying electrical measurements may include a single set of measurements for a single phase corresponding to the node.

To determine the predicted phase that corresponds to the node, the computing device may be configured to determine, for each set of time-varying electrical measurements in the first plurality, a respective ranked correlation coefficient comparing the set of time-varying electrical measurements and the second plurality of time-varying electrical measurements (204). For example, when using the Kendall rank correlation coefficient, DNM system 4 may compare pairs of time-correlated values or "observations" (each observation being a value from the set and a value from the second plurality) to other observations to determine whether the first observation and second observation are discordant or concordant, subtract the number of discordant observation pairs from the number of concordant observation pairs, and divide the result by the total number of observations.

The computing device may also be configured to determine, as the predicted phase, the phase that corresponds to the set of time-varying electrical measurements in the first plurality of time-varying electrical measurements that results in the respective ranked correlation coefficient indicating the strongest correlation (206). For example, DNM system 4, after determining ranked correlation coefficients comparing each set of measurements in the first plurality to the second plurality of measurements, may determine, as the predicted phase for the node, the phase corresponding to the set that resulted in the strongest ranked correlation coefficient. When using the Kendall rank correlation coefficient, for instance, DNM system 4 may select, as the predicted phase, the phase corresponding to the set that produced the largest (i.e., closest to 1) correlation coefficient.

In the example of FIG. 2, the computing device may also be configured to cause at least one device of the power distribution network to modify operation based at least on part on the predicted phase (208). For instance, DNM system 4 may output modification instructions 14, thereby causing one or more of network infrastructure devices 12 to modify operation based on the predicted phase for nodes 8A, 8B, and/or 8C. As another example, DNM system 4 may output an indication of the predicted phase, which other devices may use to modify operation of devices in power distribution network 2.

The example operations of FIG. 2 may be performed in a periodic fashion. That is, while only a single flow is shown, each of operations 200, 202, 204, 206, and 208 may be performed any number of times. In this way, the techniques of the present disclosure may provide regular (e.g., hourly, daily, weekly, etc.) determination of node phases for informed network management.

The techniques of the present disclosure provide accurate phase identification of nodes in a power distribution network using statistical analysis. These techniques may be particularly useful in distribution networks having high penetration of DERs, where related-art methods often fail. By leveraging AMI data, the techniques described herein may allow for simple, periodic phase identification of nodes in the network, and such information can be used to improve network management via state estimation, load balancing, fault mitigation, and other ways. Overall, the techniques described here may improve the operation, efficiency, and functionality of distribution network management systems and their distribution networks.

At least some of the techniques of the present disclosure may be additionally or alternatively described by one or more of the following examples.

Example 1. A device comprising: at least one processor configured to: determine, based on (i) a first plurality of time-varying electrical measurements corresponding to a feeder head of a power distribution network having a plurality of phases and (ii) a second plurality of time-varying electrical measurements corresponding to a node in the power distribution network, and using statistical analysis, a predicted phase, from the plurality of phases, that corresponds to the node; and cause at least one device of the power distribution network to modify operation based at least on part on the predicted phase.

Example 2. The device of example 1, wherein the time-varying electrical measurements comprise voltage measurements.

Example 3. The device of any of examples 1-2, wherein: the first plurality of time-varying electrical measurements comprises time-varying electrical measurements for at least two phases in the plurality of phases, and the second plurality of time-varying electrical measurements comprises time-varying electrical measurements for a single phase.

Example 4. The device of any of examples 1-3, wherein using statistical analysis comprises determining at least one ranked correlation coefficient.

Example 5. The device of example 4, wherein: the first plurality of time-varying electrical measurements comprises a respective set of time-varying electrical measurements for at least two phases in the plurality of phases, the second plurality of time-varying electrical measurements comprises time-varying electrical measurements for a single phase, and determining the predicted phase comprises: determining, for each respective set of time-varying electrical measurements, a respective ranked correlation coefficient comparing the respective set of time-varying electrical measurements and the second plurality of time-varying electrical measurements; and determining, as the predicted phase, the phase corresponding to the respective set of time-varying electrical measurements that results in the respective ranked correlation coefficient indicating the strongest correlation.

Example 6. The device of any of examples 4-5, wherein determining the at least one ranked correlation coefficient comprises determining at least one Kendall rank correlation coefficient.

Example 7. The device of any of examples 1-6, wherein determining the predicted phase comprises performing principle component analysis to reduce a dimensionality of at least one of: the first plurality of time-varying electrical measurements or the second plurality of time-varying electrical measurements.

Example 8. The device of any of examples 1-7, wherein the time-varying electrical measurements comprise: active power consumption measurements, reactive power consumption measurements, frequency measurements, or current measurements.

Example 9. The device of any of examples 1-8, wherein causing the at least one device of the power distribution network to modify operation based at least in part on the predicted phase comprises outputting the predicted phase to another device.

Example 10. The device of any of examples 1-9, wherein causing the at least one device of the power distribution network to modify operation based at least in part on the predicted phase comprises: causing a node of the power distribution network to be switched to a different phase from the plurality of phases to improve load balance among the plurality of phases; or causing a smart inverter of the power distribution network to modify its output real power or output reactive power to regulate voltage on a phase from the plurality of phases.

Example 11. A method comprising: determining, by a computing device comprising at least one processor, based on (i) a first plurality of time-varying electrical measurements corresponding to a feeder head of a power distribution network having a plurality of phases and (ii) a second plurality of time-varying electrical measurements corresponding to a node in the power distribution network, and using statistical analysis, a predicted phase, from the plurality of phases, that corresponds to the node; and causing at least one device of the power distribution network to modify operation based at least on part on the predicted phase.

Example 12. The method of example 11, wherein the time-varying electrical measurements comprise: voltage measurements, active power consumption measurements, reactive power consumption measurements, frequency measurements, or current measurements.

Example 13. The method of any of examples 11-12, wherein: the first plurality of time-varying electrical measurements comprises time-varying electrical measurements for at least two phases in the plurality of phases, and the second plurality of time-varying electrical measurements comprises time-varying electrical measurements for a single phase.

Example 14. The method of any of examples 11-13, wherein using statistical analysis comprises determining at least one ranked correlation coefficient.

Example 15. The method of example 14, wherein: the first plurality of time-varying electrical measurements comprises a respective set of time-varying electrical measurements for at least two phases in the plurality of phases, the second plurality of time-varying electrical measurements comprises time-varying electrical measurements for a single phase, and determining the predicted phase comprises: determining, for each respective set of time-varying electrical measurements, a respective ranked correlation coefficient comparing the respective set of time-varying electrical measurements and the second plurality of time-varying electrical measurements; and determining, as the predicted phase, the phase corresponding to the respective set of time-varying electrical measurements that results in the respective ranked correlation coefficient indicating the strongest correlation.

Example 16. The method of any of examples 14-15, wherein determining the at least one ranked correlation coefficient comprises determining at least one Kendall rank correlation coefficient.

Example 17. The method of any of examples 11-16, wherein determining the predicted phase comprises performing principle component analysis to reduce a dimensionality of at least one of: the first plurality of time-varying electrical measurements or the second plurality of time-varying electrical measurements.

Example 18. The method of any of examples 11-17, wherein causing the at least one device of the power distribution network to modify operation based at least in part on the predicted phase comprises: causing a node of the power distribution network to be switched to a different phase from the plurality of phases to improve load balance among the plurality of phases; or causing a smart inverter of the power distribution network to modify its output real power or output reactive power to regulate voltage on a phase from the plurality of phases.

In one or more examples, the techniques described herein may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media, which includes any medium that facilitates transfer of a computer program from one place to another, e.g., according to a communication protocol. In this manner, computer-readable media generally may correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable storage medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of inter-operative hardware units, including one or more processors as described above, in conjunction with suitable software and/or firmware.

The foregoing disclosure includes various examples set forth merely as illustration. The disclosed examples are not intended to be limiting. Modifications incorporating the spirit and substance of the described examples may occur to persons skilled in the art. These and other examples are within the scope of this disclosure and the following claims.

What is claimed is:

1. A device comprising:
   at least one processor configured to:
   determine, based on (i) a first plurality of time-varying electrical measurements corresponding to a feeder head of a power distribution network having a plurality of phases and (ii) a second plurality of time-varying electrical measurements corresponding to a node in the power distribution network, and using statistical analysis, a predicted phase, from the plurality of phases, that corresponds to the node; and cause at least one device of the power distribution network to modify operation based at least on part on the predicted phase, wherein: using statistical analysis comprises determining at least one ranked correlation coefficient, the first plurality of time-varying electrical measurements comprises a respective set of time-varying electrical measurements for at least two phases in the plurality of phases, the second plurality of time-varying electrical measurements comprises time-varying electrical measurements for a single phase, and determining the predicted phase comprises:

determining, for each respective set of time-varying electrical measurements, a respective ranked correlation coefficient comparing the respective set of time-varying electrical measurements and the second plurality of time-varying electrical measurements; and determining, as the predicted phase, the phase corresponding to the respective set of time-varying electrical measurements having the respective ranked correlation coefficient with a highest absolute value.

2. The device of claim 1, wherein the time-varying electrical measurements comprise voltage measurements.

3. The device of claim 1, wherein determining the at least one ranked correlation coefficient comprises determining at least one Kendall rank correlation coefficient.

4. The device of claim 1, wherein determining the predicted phase comprises performing principle component analysis to reduce a dimensionality of at least one of: the first plurality of time-varying electrical measurements or the second plurality of time-varying electrical measurements.

5. The device of claim 1, wherein the time-varying electrical measurements comprise: active power consumption measurements, reactive power consumption measurements, frequency measurements, or current measurements.

6. The device of claim 1, wherein causing the at least one device of the power distribution network to modify operation based at least in part on the predicted phase comprises outputting the predicted phase to another device.

7. The device of claim 1, wherein causing the at least one device of the power distribution network to modify operation based at least in part on the predicted phase comprises: causing a node of the power distribution network to be switched to a different phase from the plurality of phases to improve load balance among the plurality of phases; or causing a smart inverter of the power distribution network to modify its output real power or output reactive power to regulate voltage on a phase from the plurality of phases.

8. A method comprising:
determining, by a computing device comprising at least one processor, based on (i) a first plurality of time-varying electrical measurements corresponding to a feeder head of a power distribution network having a plurality of phases and (ii) a second plurality of time-varying electrical measurements corresponding to a node in the power distribution network, and using statistical analysis, a predicted phase, from the plurality of phases, that corresponds to the node; and causing at least one device of the power distribution network to modify operation based at least on part on the predicted phase, wherein: using statistical analysis comprises determining at least one ranked correlation coefficient, the first plurality of time-varying electrical measurements comprises a respective set of time-varying electrical measurements for at least two phases in the plurality of phases, the second plurality of time-varying electrical measurements comprises time varying electrical measurements for a single phase, and determining the predicted phase comprises:

determining, for each respective set of time-varying electrical measurements, a respective ranked correlation coefficient comparing the respective set of time-varying electrical measurements and the second plurality of time-varying electrical measurements; and determining, as the predicted phase, the phase corresponding to the respective set of time-varying electrical measurements having the respective ranked correlation coefficient with a highest absolute value that.

9. The method of claim 8, wherein the time-varying electrical measurements comprise: voltage measurements, active power consumption measurements, reactive power consumption measurements, frequency measurements, or current measurements.

10. The method of claim 8, wherein determining the at least one ranked correlation coefficient comprises determining at least one Kendall rank correlation coefficient.

11. The method of claim 8, wherein determining the predicted phase comprises performing principle component analysis to reduce a dimensionality of at least one of:
the first plurality of time-varying electrical measurements or the second plurality of time-varying electrical measurements.

12. The method of claim 8, wherein causing the at least one device of the power distribution network to modify operation based at least in part on the predicted phase comprises:
causing a node of the power distribution network to be switched to a different phase from the plurality of phases to improve load balance among the plurality of phases; or
causing a smart inverter of the power distribution network to modify its output real power or output reactive power to regulate voltage on a phase from the plurality of phases.

* * * * *